United States Patent
Gabay et al.

[11] Patent Number: 6,133,774
[45] Date of Patent: Oct. 17, 2000

[54] CLOCK GENERATOR AND METHOD THEREFOR

[75] Inventors: Yosef Gabay, Petach-Tikva; Itay Bar-Chen, Qiryat-Gat; Aviv Marks, Hertselia; Arnon Langbord, Haifa, all of Israel

[73] Assignee: Motorola Inc., Schaumburg, Ill.

[21] Appl. No.: 09/263,355

[22] Filed: Mar. 5, 1999

[51] Int. Cl.$^7$ ..................................................... H03K 3/00
[52] U.S. Cl. ........................... 327/291; 327/112; 327/298
[58] Field of Search ........................... 327/108–112, 291, 327/298, 276, 278, 281, 355

[56] References Cited

U.S. PATENT DOCUMENTS

| | | | |
|---|---|---|---|
| 5,444,405 | 8/1995 | Truong et al. | 327/239 |
| 5,453,707 | 9/1995 | Hiratsuka et al. | 326/97 |
| 5,568,081 | 10/1996 | Liu et al. | 327/380 |
| 5,760,620 | 6/1998 | Doluca | 327/112 |

*Primary Examiner*—Kenneth Wells

[57] ABSTRACT

A clock provider system (100) receives an input clock X1 and, shifted by 90°, an input clock X2 and provides output clock Y as a free selectable logical function Y=f(X1, X2). A signal provider (103) comprises non-inverting delay units (150) and inverting delay units (160) each forwarding the input clocks X1 and X2 with a substantially equal delay. According to the required logical function, a distributor unit (170) sends the delayed signals to control inputs of a switch matrix (100) for providing intermediate signal Z. At the output, an inverter (102) inverts Z and provides Y. In the switch matrix (100), transistor chains (115, 116, 125, 126) alternatively pull an intermediate node (130, signal Z) either to a first (191) or to a second (192) reference potential. Thereby, near reference transistors (111, 114, 121, 124) are made conductive prior to near node transistors (112, 113, 122, 123).

10 Claims, 3 Drawing Sheets

CLOCK GENERATOR AND METHOD THEREFOR

FIELD OF THE INVENTION

The present invention generally relates to electronic circuits and, more particularly, to a clock generator and to a method.

BACKGROUND OF THE INVENTION

Clock signals are periodic digital signals (e.g., rectangular form) which are used in a variety of digital circuits, for example to coordinate the function of circuit components. For example, a clock signal oscillates between a first logical state (e.g., logical "1" at a "high" voltage level) and second logical state (e.g., logical "0" at ground level) with a predetermined ratio between logical "1" and "0" times.

Some components locally use private clock signals which are sometimes combined into further clock signals. Overlapping of clock signals (e.g., two signals simultaneously at "1") is usually not desirable. When generating and distributing clock signals, propagation delays and changes of the signal form should be limited. Delays occur, for example, in logic gates (e.g., inverters, and-, or-gates, etc.) and/or in connection lines (within or outside the circuit). Signal form changes occur, for example, due to parasitic capacities and inductivities. Further, these and other unwanted effects depend on the manufacturing process.

In order to maintain features such as reliability, high operation speed, accuracy, etc., non-overlap clock generators may require, among other things, (a) the appropriate circuit layout which is expensive to provide, (b) calibration during manufacturing adding further costs, and (c) feedback loops with introduce further delay and which shorten the duty time (i.e. on-time) of the output clock. This is especially important for clock signals at high frequencies such as in the GHz-range.

Examples for clock drivers can be found, of example, in reference [1] U.S. Pat. 5,444,405 to Troung et al. and [2] U.S. Pat. No. 5,453,707 to Hiratsuka et al.

The present invention seeks to provide clock generators which mitigate or avoid these and other disadvantages and limitations of the prior art.

DETAILED DESCRIPTION OF A PREFERRED EMBODIMENT

Figure 1:
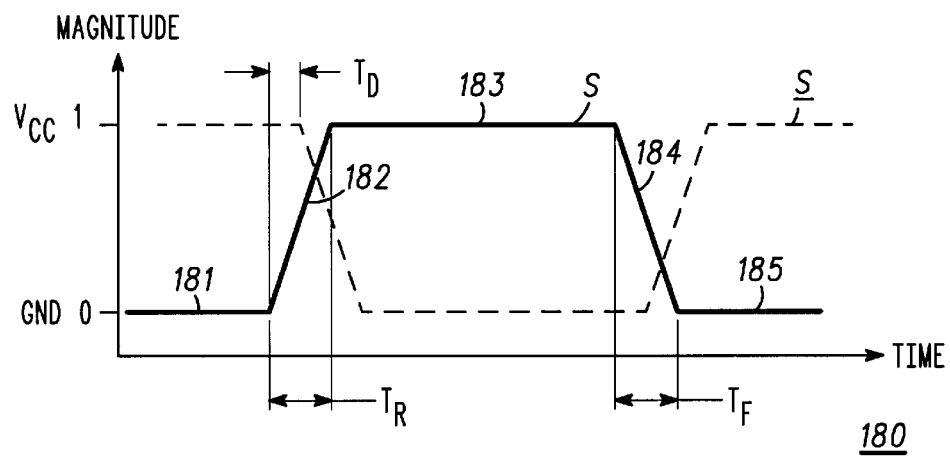
FIG. 1 illustrates a simplified time diagram of a digital signal.

FIG. 1 a illustrates simplified time diagram 180 of digital signals S and S. A person of skill in the art understands that signals are distinguished by quantities, such as, for example, of voltages, currents, or intensities. Such quantities are referred to by the term "level". Signals S and S are represented by the level on the vertical axis and the time t on horizontal axis. In reference to the figures which explain the present invention by way of example, the signals alternate between a first logical state (e.g., S at "1" in trace 183) at a first signal level (e.g., around a voltage VCC) and a second logical state (e.g., S at "0" in traces 181, 185) at a second signal level (e.g., at around a ground level GND). As used herein, the terms "assert" and "high" (and language variations) conveniently stand for logical "1, wherein the terms "negated" and "low" stands for logical "0". Conveniently, signal S has a first transition ("0-1-transition", trace 182) when signal S goes during rising time $T_R$ from "0" to "1", and has a second transition ("1-0-transition", trace 184) when signal S returns during falling time $T_F$ from "1" to "0". Signal S is the inversion to S and is illustrated by dashed traces. Here and in the following, signal inversion is indicated by underscoring. With a delay time $T_D$, signal S falls when signal S rises, and vice versa. Signals S and S can be any of the signals described in the following, such as X1, X2, X1', X2', X1', X2', Y, and Z.

This and other conventions are convenient to explain the present invention. Persons of skill in the alt are able, based on the description herein, to introduce modifications or use a design based on other conventions without departing from the scope of the invention.

In reference to FIGS. 1–7, the present invention can be described as system 100 for deriving output signal Y from binary input signal X1 and from binary input signal X2 which is phase shifted (by e.g., 90 degrees) to X1. System 100 comprises (i) transistor chain 115 of serially coupled transistors 111 and 112 for pulling node 130 with representation Z of output signal Y to reference line 191 (e.g., at VCC), wherein transistor 111 is connected to line 191 and transistor 112 is connected to node 130; (ii) transistor chain 116 of serially coupled transistors 113 and 114 for pulling node 130 to reference line 192, wherein transistor 113 is connected to node 130 and transistor 114 is connected to line 192; and (iii) switch unit 103 ("signal provider") for selectively forwarding signals X1 and X2 (optionally, X1' and X2' after delay, and inversions X1' and X2') according to a predetermined logical relation (cf. relation (1) below) to control transistors 111 to 114 such to selectively (a) make transistor 111 conductive prior to transistor 112 and (b) make transistor 114 conductive prior to transistor 113. In the following, the terms "chain" and "arrangement" are used as synonyms.

The present invention has, among other things, the advantage that falling times ($T_F$, cf. FIG. 1) and rising times ($T_R$) of the output clock signal Y are substantially independent from the logical combinations of the input clock signals X1 and X2. Also, a feedback is not required.

The overall delay from an input signal change (e.g., X1 and/or X2 having a transition) to the rise of an output signal (i.e. 0-1 transition) after the drivers is larger than the overall delay from the input signal change to the fall of the output signal (i.e. 1-0 transition). By this, non-overlapping between consecutive clocks is achieved.

Figure 2:
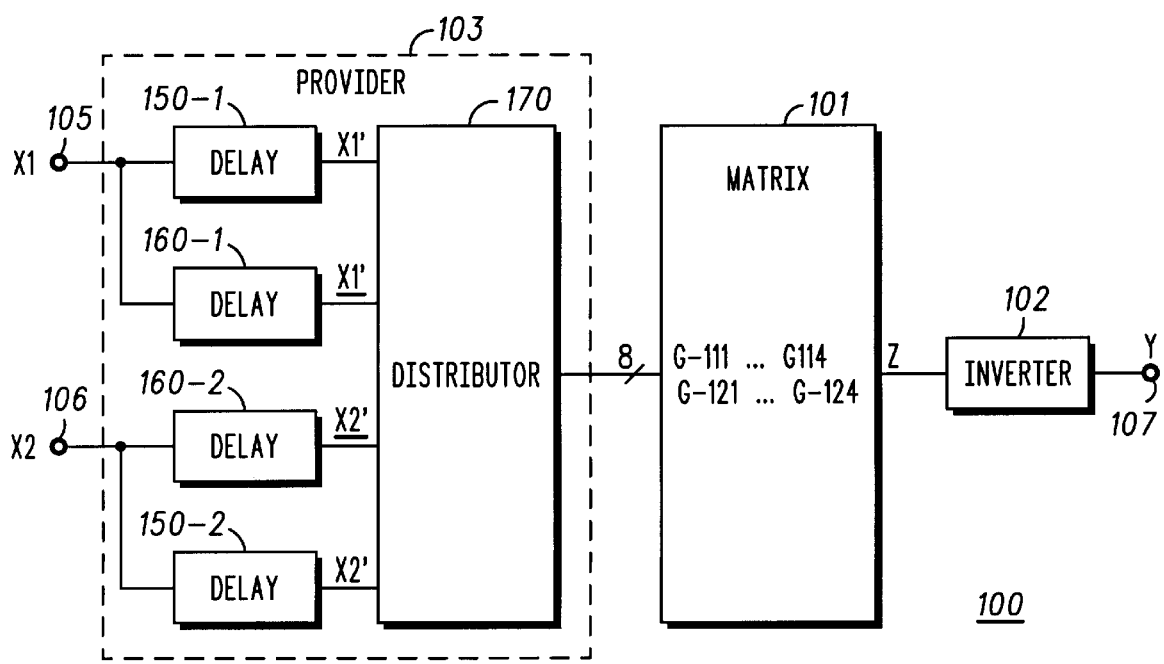
FIG. 2 illustrates a simplified block diagram of a clock generator system of the present invention.

FIG. 2 illustrates a simplified block diagram of clock generator system 100 (hereinafter system 100) of the present invention. System 100 comprises signal provider unit 103 ("PROVIDER"), switch matrix 101 (details in FIG. 3), and, optionally, inverter 102. System 100 combines input clock signals X1 at input 105 and X2 at input 106 to output clock signal Y at output 107. Preferably, system 100 is part of an electronic circuit with components (e.g., timers) receiving the signal Y. At output 107, system 100 is usually coupled to circuitry which distributes signal Y to the components and which considers their intrinsic capacities. For simplicity, such drivers are not shown. Persons of skill in the art can implement them without the need of further explanation.

Figure 6:
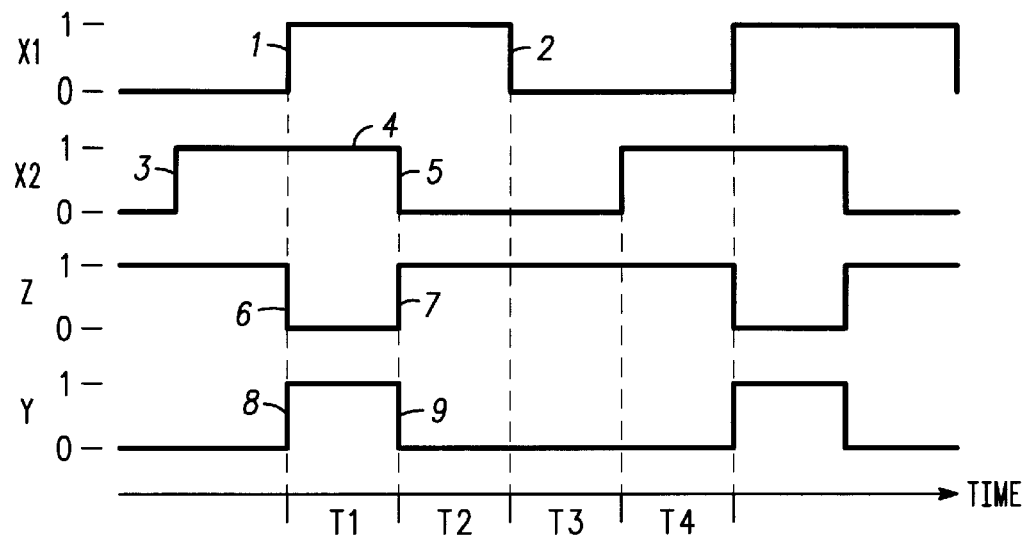
FIG. 6 illustrates a simplified time diagram for a first example illustrating the operation of the system of FIG. 2.
Figure 7:
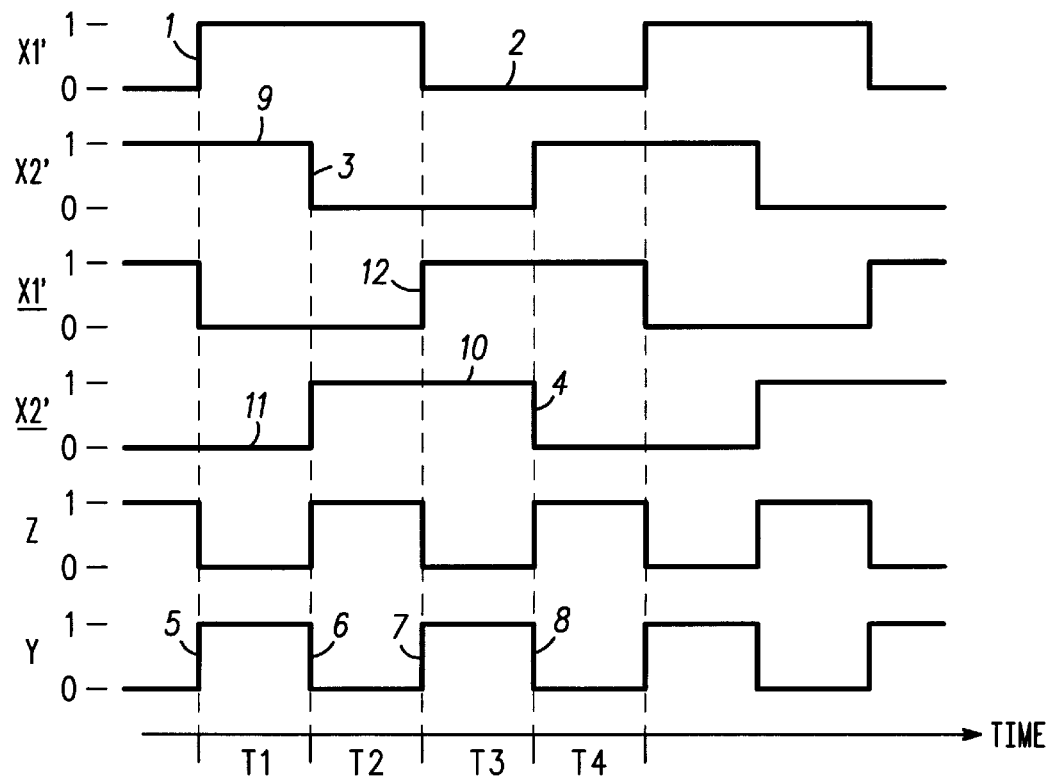
FIG. 7 illustrates a simplified time diagram for a second example illustrating the operation of the system of FIG. 2.

Conveniently, X1 and X2 are rectangular signals having equal "1" times and "0" times (cf. X1', X2' in the time diagrams of FIGS. 6–7). Signal X2 has a phase shift to X1 of about 90 degree. Providing such signals is well known in the art. System 100 combines signals X1 and X2 to signal Y by a predetermined logical function (e.g., and, or, xor), that is:

$$Y=f(DELAY (X1), DELAY (X2)) \quad (1)$$

$$Y=f(X1', X2') \quad (1a)$$

"DELAY" and the prime markers stand for a delay time ($\geq 0$) introduced by delay units. In a first example (details in FIG. 6), input signals X1 and X2 are conjunctively combined, that is:

$$Y=X1' \text{ and } X2' \quad (2)$$

In a second example, (details in FIG. 7), input signals X1 and X2 are combined by an inverted exclusive-or combination, that is:

$$Y=X1' \text{ xor } X2 \quad (3)$$

Signal provider unit 103 conveniently comprises: (i) delay unit 150-1 transferring signal X1 to signal X1' with DELAY but without inverting X1; (ii) delay unit 160-1 inverting signal X1 to signal X1' with the same DELAY; similarly, (iii) delay unit 150-2 transferring signal X2 to signal X2' with the same DELAY (without inverting X2); (iv) delay unit 160-2 inverting signal X2 with the same DELAY to signal X2'; and (v) distributor unit 170. Preferably, delay units 150-1 and 150-2 (collectively 150) are implemented as explained by example in connection with FIG. 4; and delay units 160-1 and 160-2 (collectively 160) are implemented as explained in FIG. 5. Distributor unit 170 distributes two or more selected signals of the signal set {X1', X1', X2', X2'} and further, fixed signals (not shown) at logical "1" and/or "0" states to up to 8 control inputs G-111 to G-114 and G-121–124 of switch matrix 101. Distributor unit 170 can be (a) a multiplexer with substantially equal delay for all signals or (b) a fixed wired network. Persons of skill in the art are able, based on the description herein, to implement unit 170 without the need for further explanation. Switch unit 101 provides node signal Z which is inverted to output signal Y by inverter 102, that is:

$$Y=Z \quad (4)$$

The configuration of system 100 as explained in FIG. 2 is convenient, but not essential. Depending on the actual signal combinations, some components (e.g., delay units 150-1, 150-2, 160-1, 160-2 or inverter 102) can be left out.

Figure 3:
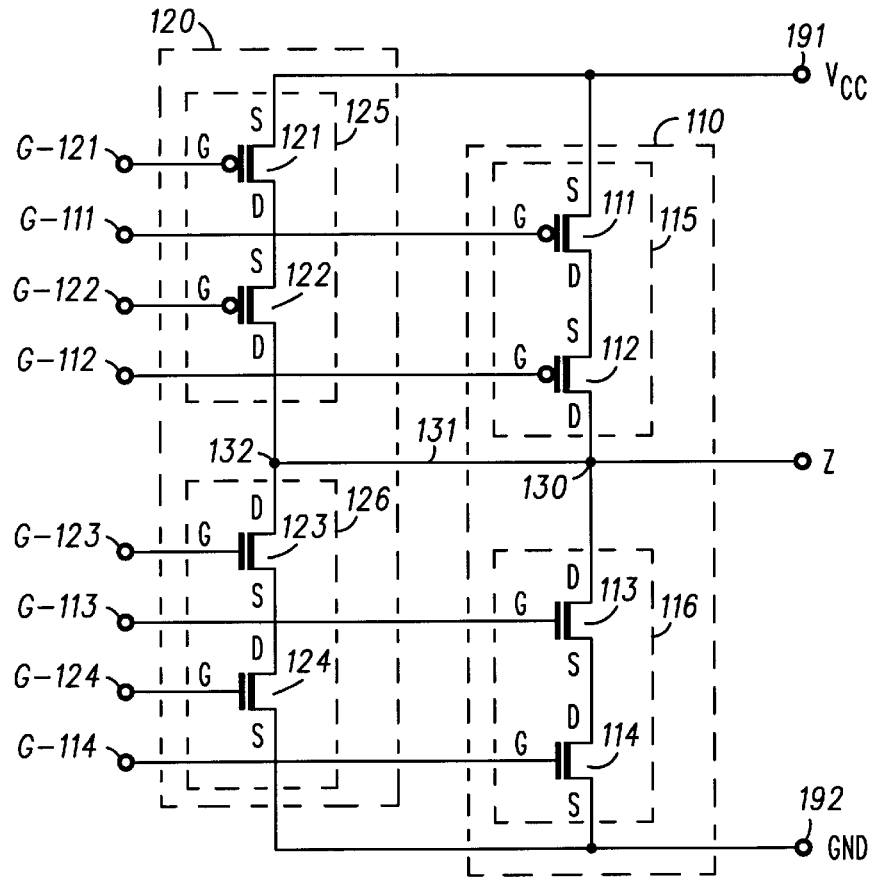
FIG. 3 illustrates a simplified circuit diagram of a switch matrix of the system of FIG. 1.

FIG. 3 illustrates a simplified circuit diagram of switch matrix 101 of system 100. Preferably, switch matrix 101 comprises transistors 111 to 114 in path 110 (dashed frame) and transistors 121 to 124 in path 120 (dashed frame). As details are explained later, the transistors are serially coupled between reference line 191 at voltage VCC (e.g., 2.5 volts) and reference line 192 at ground voltage GND (e.g., around zero volts) (lines 191, 192 also called "potentials"). Switch matrix 101 has inputs G-111 to G-114 and G-121 to G-124 at the corresponding transistor gates (G) coupled to signal provider unit 103 (cf. FIG. 2) and has output node 130 for providing signal Z.

The term "transistor" is intended to include any device having at least two main electrodes and a control electrode. The impedance between the main electrodes is controlled by a signal applied to the control electrode. Generally, the transistors are switches which can be conductive ("on state", "turned on") or non-conductive ("off state", "turned off"). Preferably, switch matrix 101 uses field effect transistors (FETs) which are either of a P-channel type (P-FETs, e.g., transistors 111, 112, 121, 122) or of an N-channel type (N-FETs, e.g., transistors 113, 114, 123, 124). Which main electrode is a drain D and which is a source S, depends on the applied voltages, so D and S are distinguished here only for the convenience of explanation. P-FETs are symbolized by a circle at the transistor gates (G). "First type" and "second type" can refer to either P-channel or to N-channel, as the case may be.

This transistor selection is convenient for explanation, but not necessary for the invention. For example, and not intended to be limiting, the channel assignment of FETs can be reversed or bipolar transistors (pnp-type and npn-type) with emitters and collectors as main electrodes and a basis as control electrode can also be used.

Transistors 111 and 112 form transistor chain 115 (or "switch chain", dashed frame) in which the source (S) of transistor 111 is coupled to line 191, the drain (D) of transistor 111 is coupled to the source (S) of transistor 112, and the drain (D) of transistor 112 is coupled to node 130. In other words, chain 115 has "near-reference" transistor 111 at reference line 191 (near potential VCC) far from node 130, and has "near node" transistor 112 at node 130 far from reference line 191.

Transistors 113 and 114 form transistor chain 116 (dashed frame) in which the drain (D) of transistor 113 is coupled to node 130, the source (S) of transistor 113 is coupled to the drain (D) of transistor 114, and the source (S) of transistor 114 is coupled to reference line 192. In other words, chain 116 has "near-node" transistor 113 at node 130 far from reference line 192, and has "near reference" transistor 114 at line 192 far from node 130.

For convenience of explanation and intended to illustrate a possible distant location within the circuit layout for switch matrix 101, node 130 is shown coupled to further node 132 via line 131. For explaining the operation of system 100, node 130, line 131 and node 132 are considered as single node 130.

Transistors 121 and 122 form transistor chain 125 (dashed frame) in which the source (S) of transistor 121 is coupled to line 191, the drain (D) of transistor 121 is coupled to the source (S) of transistor 122, and the drain (D) of transistor 122 is coupled to node 132. In other words, chain 125 has "near-reference" transistor 121 at reference line 191 (near potential VCC) far from node 132, and has "near node" transistor 122 at node 132 far from reference line 191.

Transistors 123 and 124 form transistor chain 126 (dashed frame) in which the drain (D) of transistor 123 is coupled to node 132, the source (S) of transistor 123 is coupled to the drain (D) of transistor 124, and the source (S) of transistor 124 is coupled to reference line 192. In other words, chain 126 has "near-node" transistor 123 at node 130 far from reference line 192, and has "near reference" transistor 124 at line 192 far from node 132.

Chains 115, 116, 125 and 126 with serially coupled "near node" and "near reference" transistors toggle nodes 130/132 alternately between the potentials of lines 191 (e.g., VCC) and 192 (e.g., GND). According to the present invention, signal provider unit 103 supplies control signals to the transistor gates in such an order that "near reference" transistors 111, 121, 114 and 124 become conductive prior to corresponding "near node" transistors 112, 122, 113, and 123, respectively.

Figure 4:
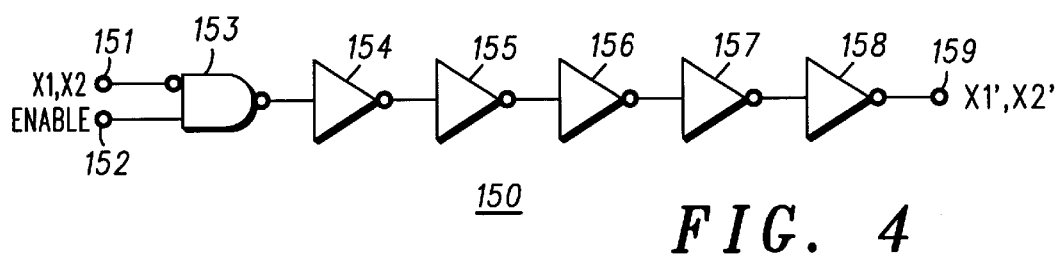
FIG. 4 illustrates a simplified block diagram of a first delay unit in a signal provider unit in the system of FIG. 2.

FIG. 4 illustrates a simplified block diagram of delay unit 150 in signal provider unit 103 in system 100. Preferably, delay unit 150 comprises an even number (e.g., 6) of serially coupled CMOS-inverters 153–158. Inverter 153 receives X1, X2 at input 151 (cf. FIG. 2, X1 from input 105, X2 from input 106) and inverter 158 provides X1', X2', respectively, to output 159. Optionally, inverter 153 (or any other inverter) is implemented with an and-function and further receives an enable signal (ENABLE) at input 152. ENABLE is conveniently used to disable delay unit 150, for example, when signals X1', X2' are not required by matrix 101. Persons of skill in the art can implement such an inverter chain without the need of further explanation.

Figure 5:
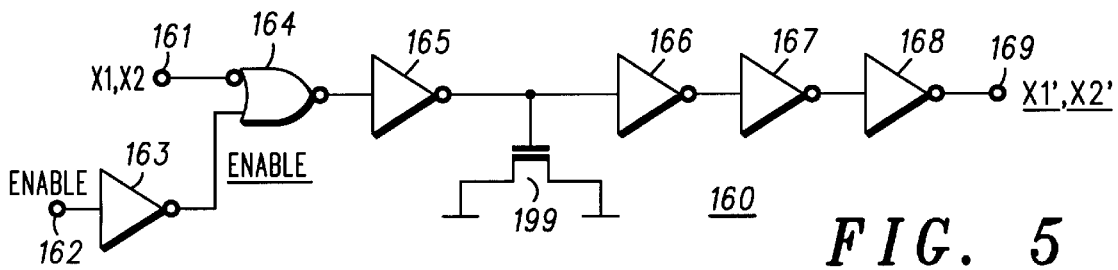
FIG. 5 illustrates a simplified block diagram of a second delay unit in the signal provider unit in the system of FIG. 2.

FIG. 5 illustrates a simplified block diagram of delay unit 160 in signal provider unit 103 in system 100. Preferably, delay unit 160 comprises an odd number (e.g., 5) of serially coupled CMOS-inverters 164–169 and, additionally, delay capacity 199. Inverter 164 receives X1, X2 at input 161 (cf. FIG. 2, X1 from input 105, X2 from input 106) and inverter 168 provides X1', X2', respectively, to output 169. Capacity 199 illustrated here, for example, after inverter 165, introduces a further delay. Therefore, above mentioned DELAY between a change in X1, X2 (both 0-1 and 1-0 transitions) and a change at outputs 159/169 is substantially equal for delay units 150 and 160. As illustrated in FIG. 5, capacity 199 is implemented by an N-FET having the gate coupled to the output of inverter 165 and having the source and the drain coupled together to a reference potential (e.g., either at line 192 or at line 191).

Optionally, inverter 164 (or any other inverter) is implemented with an or-function and further receives the signal ENABLE (input 162, inverter 163) which is, preferably, the negation to ENABLE. Similarly, delay unit 160 can be disabled when required.

FIG. 6 illustrates a simplified time diagram for the first example (and) illustrating the operation of system 100 by showing signals X1', X2', Z and Y during time intervals T1, T2, T3 and T4.

Initially, signal provider unit 103 programs the logical function (cf. equation (2), delay neglected) of switch matrix 101 (cf. FIG. 3) by continuously sending logical "0" to control input G-121 of switch 121 in chain 125, logical "0" to control input G-111 of switch 111 in chain 115, and logical "0" to control inputs G-123 and G-124 in chain 126. Therefore, "near potential" switches 121 and 111 (P-FETs, at line 191) are continuously conductive, and chain 126 with transistors 123 and 124 are continuously non-conductive.

Signal provider unit 103 provides signals X1' to switches 122 and 113, and provides signal X2' to switches 112 and 114. Signal X1' going to logical "1" (e.g., trace 1) makes "near node" switch 113 of chain 116 conductive when "near reference" switch 114 of chain 116 has already been made conductive by signal X2' (e.g., traces 3, 4). Conductive switches 113 and 114 (and-function) of chain 116 pull node 130 to reference line 192. Signal Z goes to logical "0" (e.g., trace 6) and signal Y goes to logical "1" (trace 8). In the alternative, either signal X1' going to logical "0" (e.g., trace 2) or signal X2' going to logical "0" (e.g., trace 5) cause "near node" switch 122 or 112, respectively, to make chain 125 or 115, respectively, conductive. As mentioned above, "near reference" switches 121 and 111, respectively, are already conductive. Conductive chain 125 or 115 pulls node 132 to line 191 and signal Z goes to logical "1" (e.g., trace 7) and signal Y goes to logical "0" (trace 9).

In other words, the "0-1" transition (e.g., trace 1) of leading signal X1' switches on "near node" transistor 113 when the phase shifted signal X2' is already established at logical "1" (e.g., trace 4) and has already switched on transistor 114. Then, the "1-0" transition (e.g., trace 5) of signal X2' (or, later, signal X1') switches on "near node" transistor 112 (transistor 122, respectively) while corresponding "near reference" transistor 111 (121 respectively) has already been switched on.

FIG. 7 illustrates a simplified time diagram for the second example ("xor") illustrating the operation of system 100 by showing signals X1', X2', X1', X2', Z and Y. Signal provider 103 sends signal X1' to control inputs G-111 and G-123, signal X1' to control inputs G-121 and G-113, signal X2' to control inputs 122 and 124, and signal X2' to inputs 112 and 114. System 100 cyclically goes through the following 4 states:

(a) in time interval $T_1$ when X1'="1" and X2'="1"  (5)

(b) in time interval $T_2$ when X1'="1" and X2'="0"  (6)

(c) in time interval $T_3$ when X1'="0" and X2'="0"  (7)

(d) in time interval $T_4$ when X1'="0" and X2'="1"  (8)

First, transistors 113, 114, 123, and 124 between node 130 (line 131 and node 132 in combination) and line 192 are considered. The signals which cause the second transition (to "0") of signal Z (signal Y to "1", traces 5 and 7) are (a) X1' with its positive edge (to "1", trace 1) and (b) X1' with its positive edge (to "1", trace 12). When X1' rises, then X2' is still asserted ("1", trace 9) and when X1' rises, then X2' is already asserted (trace 10). For that reasons, X1' and X1' are supplied to "near node" transistors 123 and 113, respectively, and phaseshifted signals X2' and X2' are supplied to "near reference" transistors 124 and 114, respectively.

Now, transistors 111, 112, 121, and 122 between line 191 and node 130 are considered. The signals which cause the first transition (to "1") of signal Z (signal Y to "0", traces 6 and 8) are (a) X2' with its negative edge (to "0", trace 3) and (b) X2' with its negative edge (to "0", trace 4). When X2' falls, then X1' is already at zero (trace 11) and when X2' falls, then X1' is already at zero (trace 2). For that reason, X2' and X2' are supplied to "near node" transistors 112 and 112, respectively, and signals X1' and X1' (phase-shifted in respect to X2' and X2', respectively) are supplied to "near reference" transistors 121 and 111, respectively.

Table 1 illustrates, by way of example, the implementation of other logical functions Y=f(X1', X2'). Column (1) indicates a reference abbreviation; column (2) indicates the logical function; and columns (3) to (10) indicate the signals supplied to transistors which can be logical "1", "0", X1', X2', X1', or X2'. Among them, signals at "near node" transistors 112, 113, 122, 123 are written in boldface. The abbreviation in column (1) indicates during which time intervals T1 to T4 (cf. FIGS. 6–7), signal Y is at logical "1" state. For convenience, columns (3) to (10) also indicate the transistor types (P-FET or N-FET). Symbol "-" illustrates that a transistor is permanently in an on-state (conductive), such as a P-FET receiving "0" or a N-FET receiving "1"; and symbol "-- --" illustrates that a transistor is permanently in an off-state (non-conductive), such as a P-FET receiving "1" or a N-FET receiving "0".

TABLE 1

Implementation of Logical Functions

| (1) | (2) function | (3) | (4) | (5) | (6) | (7) | (8) | (9) | (10) |
|---|---|---|---|---|---|---|---|---|---|
|  |  | \multicolumn{8}{c}{signals supplied to transistors} |
|  |  | P chain 115 | | N chain 116 | | P chain 125 | | N chain 126 | |
|  |  | 111 | 112 | 113 | 114 | 121 | 122 | 123 | 124 |
| T1 | Y = X' *and* X2' (first example, cf. FIG. 6) | 0 | X2' | X1' | X2' | 0 | X1' | 0 | 0 |
|  |  | — |  |  |  | — |  | chain 126 disabled | |
| T13 | Y = X1' *xor* X2 (second example, cf. FIG. 7) | X1 | X2 | X1 | X2 | X1 | X2 | X1 | X2 |
| T12 | Y = X1' | 1 | 1 | 0 | 0 | 0 | X1' | X1' | 1 |
|  |  | -- -- | -- -- | -- -- | -- -- |  |  |  |  |
|  |  | \multicolumn{4}{l}{path 110 disabled} | | \multicolumn{2}{l}{path 120 as inverter} | | |
| T14 | Y = X2' | 1 | 1 | 0 | 0 | 0 | X2' | X2' | 1 |
|  |  | -- -- | -- -- | -- -- | -- -- |  |  |  |  |
|  |  | \multicolumn{4}{l}{path 110 disabled} | | \multicolumn{2}{l}{path 120 as inverter} | | |
| T34 | Y = X1' | 1 | 1 | 0 | 0 | 0 | X1' | X1' | 1 |
|  |  | -- -- | -- -- | -- -- | -- -- |  |  |  |  |
|  |  | \multicolumn{4}{l}{path 110 disabled} | | \multicolumn{2}{l}{path 120 as inverter} | | |
| T23 | Y = X2' | 1 | 1 | 0 | 0 | 0 | X2' | X2' | 1 |
|  |  | -- -- | -- -- | -- -- | -- -- |  |  |  |  |
|  |  | \multicolumn{4}{l}{path 110 disabled} | | \multicolumn{2}{l}{path 120 as inverter} | | |
| T2 | Y = X1' *and* X2' | 0 | X1' | X2' | X1' | 0 | X2' | 0 | 0 |
|  |  |  |  |  |  | — |  | -- -- | -- -- |
|  |  |  |  |  |  |  |  | 126 diabled | |
| T3 | Y = X1' *and* X2' | 0 | X2' | X1' | X2' | 0 | X1' | 0 | 0 |
|  |  |  |  |  |  | — |  | -- -- | -- -- |
|  |  |  |  |  |  |  |  | 126 diabled | |
| T4 | Y = X1' *and* X2' | 0 | X1' | X2' | X1' | 0 | X2' | 0 | 0 |
|  |  |  |  |  |  | — |  | -- -- | -- -- |
|  |  |  |  |  |  |  |  | 126 diabled | |
| T123 | Y = X1' *or* X2' | 1 | 1 | X1' | 1 | X1 | X2' | X2' | 1 |
|  |  | -- -- | -- -- |  |  |  |  |  | — |
|  |  | chain 115 disabled | | | | | | | |
| T234 | Y = X1' *or* X2' | 1 | 1 | X2' | 1 | X2' | X1' | X1' | 1 |
|  |  | -- -- | -- -- |  |  |  |  |  | — |
|  |  | chain 115 disabled | | | | | | | |
| T341 | Y = X1' *or* X2' | 1 | 1 | X1' | 1 | X1' | X2' | X2' | 1 |
|  |  | -- -- | -- -- |  |  |  |  |  | — |
|  |  | chain 115 disabled | | | | | | | |
| T412 | Y = X1' *or* X2' | 1 | 1 | X2' | 1 | X2' | X1' | X1' | 1 |
|  |  | -- -- | -- -- |  |  |  |  |  | — |
|  |  | chain 115 disabled | | | | | | | |
| T24 | Y = X1' *xor* X2' | X2' | X1' | X2' | X1' | X2' | X1' | X2' | X1' |

A method of the present invention can be described as a method for deriving a digital output signal Y according to a predetermined logical function "f" from a first input signal X1 (periodic and digital) and a second input signal X2 (also periodic and digital), wherein both input signals X1 and X2 have a substantially equal duty cycle (e.g., time at "1"), but wherein signal X2 exhibits a phase difference of a quarter period (e.g., 90° advanced or lagging behind). The method comprises the following steps:

(1) Delaying input signals X1 and X2 to intermediate signals (e.g., X1', X2', X1', X2'), such as when an input signal toggles (1-0-transition, or 0-1-transition), the intermediate signal toggles with a predetermined delay ("DELAY") and, selectively, (a) with the same logical transition (1-0, 0-1, respectively) as the input signal, and (b) with an inverted logical transition (0-1, 1-0, respectively).

(2) Switching on arrangements (e.g., chains 115, 116, 125, 126) each having a first transistor (e.g., 111, 114, 121, 124, respectively) at a first (191) or at a second (192) reference potential and, serially coupled, a second transistor (e.g., 112, 113, 122, 123) at node 130 representing the output signal (e.g., by signal Z). First and second transistors being switched on by intermediate signals (e.g., X1', X2', X1', X2', see table). The first transistor is switched on prior to the second transistor.

Having described details, the present invention is now described as system 100 for providing output clock signal Y by combining periodic input clock signal X1 (or X1') with phaseshifted, periodic input clock signal X2 (or X2'). System 100 comprises: (a) signal provider unit 103 which inverts signal X1 to intermediate signal X1' and which inverts signal X2 to intermediate signal X2'; and (b) switch matrix 101 having a first switch chain (e.g., chain 115, or "arrangement") between reference potential 191 substantially corresponding to first signal level VCC (e.g., logical "1"), node 130 for deriving output clock signal Y and a second switch chain (e.g., chain 116) between node 130 and reference potential 192 substantially corresponding to second signal level GND (e.g., logical level "0"), wherein the chains each comprise a near node switch (e.g., transistor 112 or transistor 113) at node 130 and serially coupled far node switch (e.g., transistor 111 or transistor 114) near the respective reference potential (potential 191 or 192, respectively), the switches (e.g., transistors 111, 112, 113, 114) controlled signal provider unit 103 by at least two signals from a signal set (e.g., X1', X2', X1', X2') of input clock signals X1 and X2 and intermediate signals X1' and X2' to alternately pull node 130 with a representation (e.g., signal Z) of output signal Y to the reference potentials at either first or second signal levels, wherein in each switch chain the far node switch (e.g., transistor 111 or 114) near reference potential is switched on prior to the near node switch (e.g., transistor 112 or 113).

While the invention has been described in terms of particular structures, devices and methods, those of skill in the art will understand based on the description herein that it is not limited merely to such examples and that the full scope of the invention is properly determined by the claims that follow.

What is claimed is:

1. A system for providing an output clock signal by combining a first periodic input clock signal with a second, phase shifted, periodic input clock signal, said system comprising:

a signal provider unit which converts the first input clock signal to a first intermediate signal and which converts the second input clock signal to a second intermediate signal; and a switch matrix having a first switch arrangement coupled between a first reference potential conductor for receiving a first signal level and a first node for deriving said output clock signal, and having a second switch arrangement coupled between the first node and a second reference potential conductor for receiving a second signal level, wherein each of the first and the second switch arrangements comprises a near node switch at said first node and a serially coupled far node switch near the respective reference potential conductor, said switches controlled by said signal provider unit by at least two signals from a signal set of the first and second input clock signals and the first and second intermediate signals to alternately pull said first node which represents said output signal to either said first or second signal level, wherein in each switch arrangement said far node switch is switched on prior to said near node switch.

2. The system of claim 1, further comprising:

a third switch arrangement between said first reference potential conductor and a second node; and a fourth switch arrangement between said second node and said second reference potential conductor, wherein said third and fourth switch arrangements are controlled by two signals from said signal set and wherein said second node is coupled to said first node.

3. The system of claim 1, wherein an inverter derives said output clock signal from a node signal at said first node.

4. The system of claim 1, wherein said signal provider unit comprises a delay unit and an inverting delay unit, which provide said first intermediate signal with substantially equal delay.

5. The system of claim 1, wherein said switches of said first arrangement are transistors of a first type serially coupled by main electrodes, said transistors of said first arrangement becoming conductive when a control signal at control electrodes is substantially equal to said second signal level; and said switches of said second arrangement are transistors of a second type serially coupled by main electrodes, said transistors of said second arrangement becoming conductive when a control signal at control electrode is substantially equal to said first signal level.

6. The system of claim 1, wherein said first switch arrangement comprises P-channel field effect transistors (P-FETs) and said second switch arrangement comprises N-channel field effect transistor (N-FETs).

7. The system of claim 1, wherein said second, phase shifted input clock signal follows said first input clock signal by a phase difference of about 90 degrees.

8. System for deriving an output signal from a first binary input signal and from a second binary input signal which is phase shifted to said first binary input signal, said system comprising:

a first transistor chain of serially coupled first and second transistors for pulling a node with a representation of said output signal to a first reference line, said first transistor connected to said first reference line and said second transistor connected to said node;

a second transistor chain of serially coupled third and fourth transistors for pulling said node to a second reference line, said third transistor connected to said node and said fourth transistor connected to said second reference line; and a switch unit for selectively forwarding said first binary input signal and said second binary input signal according to a predetermined logical relation to control said first, second, third and fourth transistors such to selectively (a) make said first transistor conductive prior to said second transistor and (b) make said fourth transistor conductive prior to said third transistor.

9. The system of claim 8 wherein said first and second transistors are field effect transistors of a first type and said third and fourth transistors are field effect transistors of a second type with opposite conductivity.

10. Method for deriving a digital output signal according to a predetermined logical function from a first periodic digital input signal and a second periodic digital input signal, the second input signal having a substantially equal duty cycle as the first input signal, but exhibiting a phase difference of a quarter period, said method comprising the following steps:

delaying the input signals to generate intermediate signals, such that when an input signal toggles, the intermediate signal toggles with a predetermined delay and, selectively, (a) with the same logical transition as the input signal, or (b) with an inverted logical transition; and switching on arrangements each having a first transistor at a first or a second reference potential and, serially coupled, a second transistor at a node representing the output signal, said first and second transistors being switched on by said intermediate signals wherein said first transistor is switched on prior to said second transistor.

* * * * *